(12) United States Patent
Dai et al.

(10) Patent No.: US 11,264,249 B2
(45) Date of Patent: Mar. 1, 2022

(54) CARBON CONTAINING HARDMASK REMOVAL PROCESS USING SULFUR CONTAINING PROCESS GAS

(71) Applicants: Mattson Technology, Inc., Fremont, CA (US); Beijing E-Town Semiconductor Technology, Co., Ltd., Beijing (CN)

(72) Inventors: Fen Dai, Fremont, CA (US); Tinghao Wang, Fremont, CA (US); Oliver D. Jan, Fremont, CA (US); Moo-Hyun Kim, Dublin, CA (US); Shawming Ma, Sunnyvale, CA (US); Zhongming Liu, Wuhan (CN)

(73) Assignees: Mattson Technology, Inc., Fremont, CA (US); Beijing E-Town Semiconductor Technology Co., Ltd., Beijing (CN)

( * ) Notice: Subject to any disclaimer, the term of this patent is extended or adjusted under 35 U.S.C. 154(b) by 0 days.

(21) Appl. No.: 16/713,281

(22) Filed: Dec. 13, 2019

(65) Prior Publication Data

US 2020/0194277 A1   Jun. 18, 2020

Related U.S. Application Data

(60) Provisional application No. 62/781,146, filed on Dec. 18, 2018.

(51) Int. Cl.
*H01L 21/311* (2006.01)
*H01L 21/033* (2006.01)

(52) U.S. Cl.
CPC .... *H01L 21/31122* (2013.01); *H01L 21/0332* (2013.01); *H01L 21/0337* (2013.01); *H01L 21/31144* (2013.01)

(58) Field of Classification Search
CPC .................................. H01L 21/31116
See application file for complete search history.

(56) References Cited

U.S. PATENT DOCUMENTS 7,432,210 B2   10/2008   Wang et al.
8,133,819 B2   3/2012    Wang et al.
(Continued)

FOREIGN PATENT DOCUMENTS

KR   10-1225544   1/2013

OTHER PUBLICATIONS

PCT International Search Report and Written Opinion for corresponding PCT Application No. PCT/US2019/066154, dated Apr. 10, 2020, 10 pages.

*Primary Examiner* — Thomas T Pham
(74) *Attorney, Agent, or Firm* — Dority & Manning, P.A.

(57) ABSTRACT

Apparatus, systems, and methods for conducting a hardmask (e.g., carbon containing hardmask) removal process on a workpiece are provided. In one example implementation, a process can include admitting a process gas into a plasma chamber, generating a plasma in the plasma chamber from the process gas using an inductively coupled plasma source, and exposing the carbon containing hardmask to the plasma to remove at least a portion of the carbon containing hardmask. The process gas can include a sulfur containing gas. The process gas does not include a halogen containing gas. The inductively coupled plasma source can be separated from the plasma chamber by a grounded electrostatic shield to reduce capacitive coupling between the inductively coupled plasma source and the plasma.

18 Claims, 5 Drawing Sheets

(56) References Cited

U.S. PATENT DOCUMENTS

| | | | |
|---|---|---|---|
| 8,501,627 B2 | 8/2013 | Chi et al. | |
| 9,362,133 B2* | 6/2016 | Shamma | H01L 21/67069 |
| 9,941,123 B1 | 4/2018 | Abatchev et al. | |
| 2004/0053505 A1* | 3/2004 | Chinn | H01L 21/3081 |
| | | | 438/710 |
| 2007/0012250 A1* | 1/2007 | Yeom | H01J 37/321 |
| | | | 118/723 AN |
| 2008/0160774 A1 | 7/2008 | Kim et al. | |
| 2010/0327413 A1 | 12/2010 | Lee et al. | |
| 2015/0004795 A1 | 1/2015 | Ishii | |
| 2015/0064914 A1 | 3/2015 | Kong et al. | |
| 2015/0099367 A1* | 4/2015 | Kim | H01J 37/32165 |
| | | | 438/715 |
| 2015/0235864 A1* | 8/2015 | Vogt | H01L 21/31144 |
| | | | 438/694 |
| 2016/0307764 A1* | 10/2016 | Gupta | H01L 21/30621 |
| 2018/0315615 A1 | 11/2018 | Rastogi et al. | |
| 2018/0358220 A1 | 12/2018 | Yu et al. | |
| 2019/0108974 A1* | 4/2019 | Rogers | H01J 37/32522 |
| 2020/0194272 A1* | 6/2020 | Jain | H01L 21/3081 |

\* cited by examiner

CARBON CONTAINING HARDMASK REMOVAL PROCESS USING SULFUR CONTAINING PROCESS GAS

PRIORITY CLAIM

The present application claims the benefit of priority of U.S. Provisional Application Ser. No. 62/781,146, titled "Carbon Containing Hardmask Removal Process Using Sulfur Containing Process Gas," filed on Dec. 18, 2018, which is incorporated herein by reference.

FIELD

The present disclosure relates generally to processing semiconductor workpieces.

BACKGROUND

Plasma etch processes (e.g., dry etch processes) can be used in semiconductor fabrication as a method for removing hardmask and/or other materials patterned on a workpiece. Plasma etch processes can use reactive species generated by inducing a plasma from one or more process gases to etch and/or remove hardmask and other mask layers from a surface of a workpiece. For instance, in some plasma etch processes, species from a plasma generated in a plasma chamber can be exposed to a workpiece, such as a semiconductor wafer, to remove at least a portion of a hardmask from the surface of the workpiece.

SUMMARY

Aspects and advantages of embodiments of the present disclosure will be set forth in part in the following description, or may be learned from the description, or may be learned through practice of the embodiments.

One example aspect of the present disclosure is directed to a process for etching a carbon containing hardmask on a workpiece. The process can include admitting a process gas into a plasma chamber. The process gas can include a sulfur containing gas and the process gas does not include a halogen containing gas. The process can include generating a plasma in the plasma chamber from the process gas using an inductively coupled plasma source. The inductively coupled plasma source can be separated from the plasma chamber by a grounded electrostatic shield. The process can include exposing the carbon containing hardmask to the plasma to remove at least a portion of the carbon containing hardmask.

Other example aspects of the present disclosure are directed to systems, methods, and apparatus for processing of workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
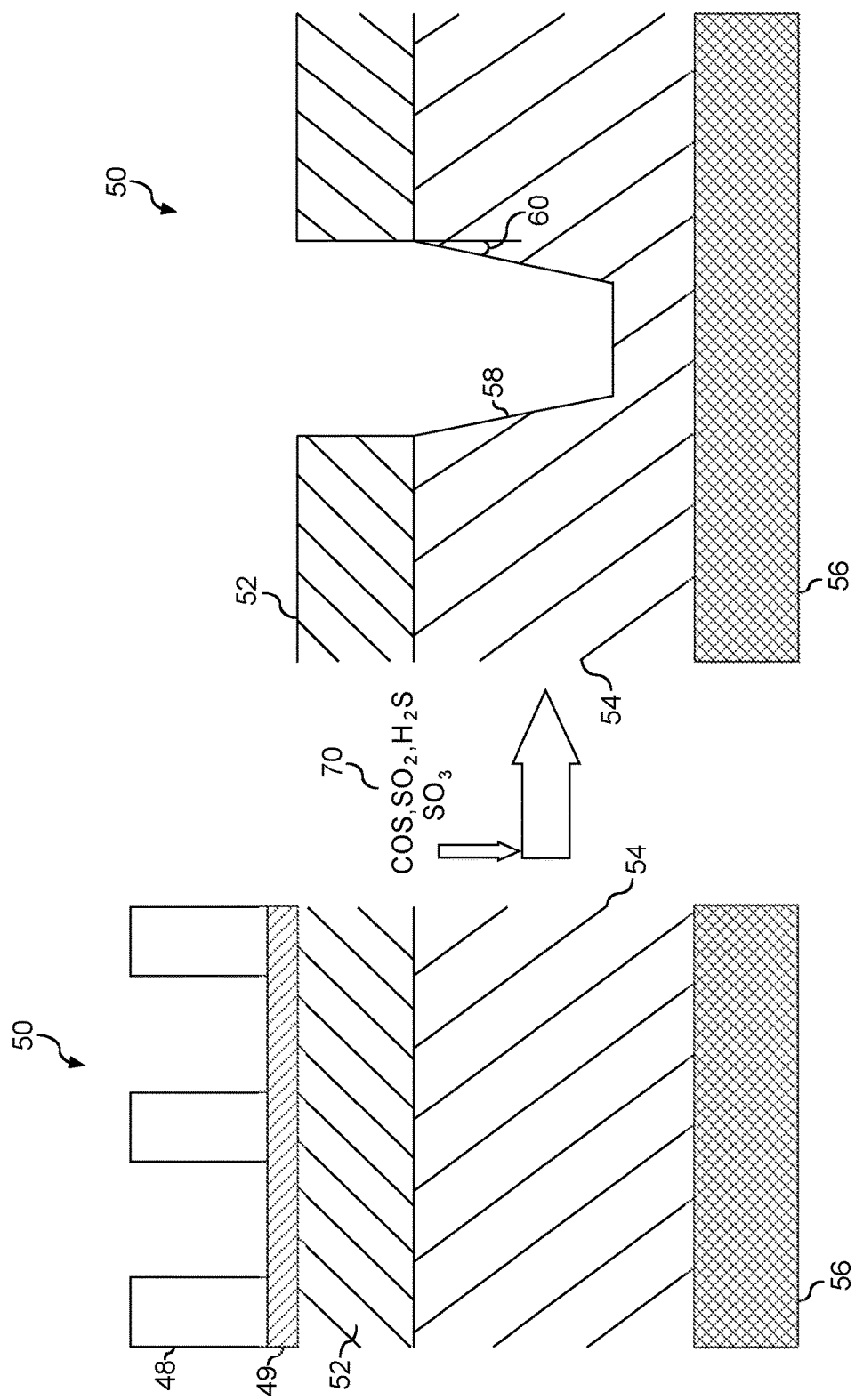
FIG. 1 depicts an example carbon containing hardmask removal process on a structure according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to processes for removing a carbon containing hardmask from a workpiece in semiconductor processing. Various materials such as carbon containing materials (e.g., boron or metal doped amorphous carbon) can be used as a hardmask layer in various dielectric etch applications (e.g., high aspect ratio dielectric etch applications) to produce advanced semiconductor devices. Plasma strip processes can be used to remove remaining hardmask after conducting etch processes. As device features continue to shrink, very high selectivity for critical dimension control can be required.

According to example aspects of the present disclosure, a plasma based etch process can use a sulfur containing process gas that does not include a halogen containing gas to etch a carbon containing hardmask. More particularly, example aspects of the present disclosure are directed to a process for etching a carbon containing hardmask on a workpiece (e.g., as part of an opening process for the hardmask). The process can include admitting a process gas into a plasma chamber, generating a plasma in the plasma chamber from the process gas using an inductively coupled plasma source, and exposing the carbon containing hardmask to the plasma to remove at least a portion of the carbon containing hardmask. The process gas can include a sulfur containing gas. The process gas does not include a halogen containing gas. The inductively coupled plasma source can be separated from the plasma chamber by a grounded electrostatic shield to reduce capacitive coupling between the inductively coupled plasma source and the plasma.

In some embodiments, the sulfur containing gas can include carbonyl sulfide (COS), sulfur dioxide ($SO_2$), hydrogen sulfide ($H_2S$), and/or sulfur trioxide ($SO_3$). In some embodiments, the process gas can further include etching gas, such as carbon monoxide (CO), nitrogen ($N_2$), carbon dioxide ($CO_2$), oxygen ($O_2$), ozone ($O_3$), water vapor ($H_2O$), hydrogen peroxide ($H_2O_2$), nitrogen trihydride ($NH_3$), dinitrogen tetrahydride ($N_2H_4$), hydrogen ($H_2$), or nitrogen monoxide (NO). In some embodiments, the process gas can further include a dilution gas, such as an inert gas, (e.g., helium (He), argon (Ar), neon (Ne), or xenon (Xe). In some embodiments, the process gas can further include passivation gas. The passivation gas can include methane ($CH_4$), ethylene ($C_2H_4$), ethane ($C_2H_6$), propene ($C_3H_6$), or propane ($C_3H_8$).

In some embodiments, the process can include etching the carbon containing hardmask to form various trench features such that the carbon containing hardmask can have a profile of a cross-section with various shapes. Examples of a profile can include a vertical profile, a sloped profile (e.g., a slight sloped profile, a deep sloped profile, or a profile with any suitable sloped angles), or any other suitable profile with any suitable shape.

In some embodiments, a dielectric hardmask can be located on top of the carbon containing hardmask. The process can include etching the dielectric hardmask prior to etching the carbon containing hardmask. For instance, the dielectric hardmask can be etched to form a trench feature with a sloped profile or a vertical profile. After the dielectric hardmask etch process, the carbon containing hardmask can be etched to form a trench feature with a sloped profile or vertical profile. In some embodiments, the process can include conducting a strip process for removal of photoresist after the dielectric hardmask etch process.

In some embodiments, the inductively coupled plasma source can be energized with a radio frequency (RF) source to generate the plasma. The plasma chamber can include a grounded electrostatic shield (e.g., Faraday shield) proximate to the inductively coupled plasma source. For instance, the grounded electrostatic shield can be located between the inductively coupled plasma source and a dielectric window forming at least a portion of the plasma chamber. In some embodiments, a pressure of the plasma chamber can be less than about 20 millitorr (mT) during plasma processing.

In some embodiments, the inductively coupled plasma source can include a first inductive coupling element and a second inductive coupling element. The first inductive coupling element and the second inductive coupling element can be energized with a separate RF sources at different RF frequencies (e.g., about 13.56 MHz and about 2 MHz respectively)

In some embodiments, the process can further include energizing an RF bias source. For instance, the RF bias source can be coupled to a workpiece support configured to support the workpiece in a processing chamber. In some embodiments, a ratio between an RF source power of the RF source and a bias power of the RF bias source can be in a range of about 2:1 to about 20:1.

Example process parameters for a carbon hardmask opening process according to example embodiments of the present disclosure are provided below:

EXAMPLE 1

Process Gas: COS
Dilution Gas: $N_2$
Process Pressure: 5 mT
Inductively Coupled Plasma Source/Center Power: 300 $W_s$/300 $W_c$
Workpiece Temperature: 35° C.
Process Period: 75 sec
Gas Flow Rates for Process Gas: 30 sccm The hardmask etch processes according to example aspects of the present disclosure can provide a number of technical effects and benefits. For example, the hardmask etch processes according to example aspects of the present disclosure can provide an improved line edge roughness (e.g., smoother line edge) for a trench feature and can provide profile control with good selectivity to top mask materials. As another example, the hardmask removal processes according to example aspects of the present disclosure can reduce top dielectric hardmask erosion and/or bottom dielectric or metal film loss.

The process(s) can provide for a smoother profile sidewall comparing to conventional halogen-based plasma etch processes for etching carbon containing hardmask. The processes according to example aspects of the present disclosure can reduce defects from hardmask residue. When sulfur containing process gas without halogen containing gas is used according to example aspects of the present disclosure in an inductively coupled plasma chamber with a grounded electrostatic shield, top dielectric hardmask erosion or bottom dielectric or metal film loss can be further reduced due to lower ion energy bombardment provided by the inductively coupled plasma chamber when compared to capacitively coupled plasma.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within twenty percent (20%) of the stated numerical value. A "pedestal" refers to any structure that can be used to support a workpiece.

With reference now to the FIGS., example embodiments of the present disclosure will now by discussed in detail. FIG. 1 depicts an example carbon containing hardmask etch process on a structure 50 according to example embodiments of the present disclosure. The structure 50 includes a photoresist layer 48, a dielectric hardmask layer 52, a carbon containing hardmask layer 54 (e.g., amorphous carbon hardmask), and a substrate layer 56. In some embodiments (not shown in FIG. 1), the substrate layer 56 can be a semiconductor substrate, such as silicon, silicon germanium, or III-V semiconductor substrate.

A plasma etch process 70 according to example aspects of the present disclosure can be conducted on the structure 50 to remove the photoresist layer 48 and to open the dielectric hardmask layer 52 and the carbon containing hardmask layer 54. The plasma etch process 70 can be any etch process and can use a variety of process gases.

In some embodiments, the plasma etch process 70 exposes the dielectric hardmask layer 52 to one or more species generated in a plasma chamber from a process gas having a sulfur containing gas (e.g., COS, $SO_2$, $H_2S$, $SO_3$) to open the dielectric hardmask layer 52. The process gas does not include a halogen containing gas. For instance, the process gas does not contain $CF_4$, HBr, $Cl_2$, $CHF_3$, $CH_2F_2$, $CH_3F$, $C_3F_6$, $C_4F_8$, $C_4F_6$, or $C_5F_8$.

After opening the dielectric hardmask layer 52, the plasma etch process 70 then exposes the carbon containing hardmask layer 54 to the one or more species to open the carbon containing hardmask layer 54. As can be seen in FIG. 1, the carbon containing hardmask layer 54 forms a trench feature with a slight sloped profile 58 having a slope angle 60. Any remaining photoresist layer 48 can be removed using a plasma strip process or other strip process.

In some embodiments, the structure 50 includes an anti-reflective coating layer 49 between the photoresist layer 48 and the dielectric hardmask layer 52. The plasma etch process 70 according to example aspects of the present disclosure can be conducted on the structure 50 to remove the photoresist layer 48 and the anti-reflective coating layer 49, and to open the dielectric hardmask layer 52 and the carbon containing hardmask layer 54. Any remaining photoresist layer 48 can be removed using a plasma strip process or other strip process.

Figure 2:
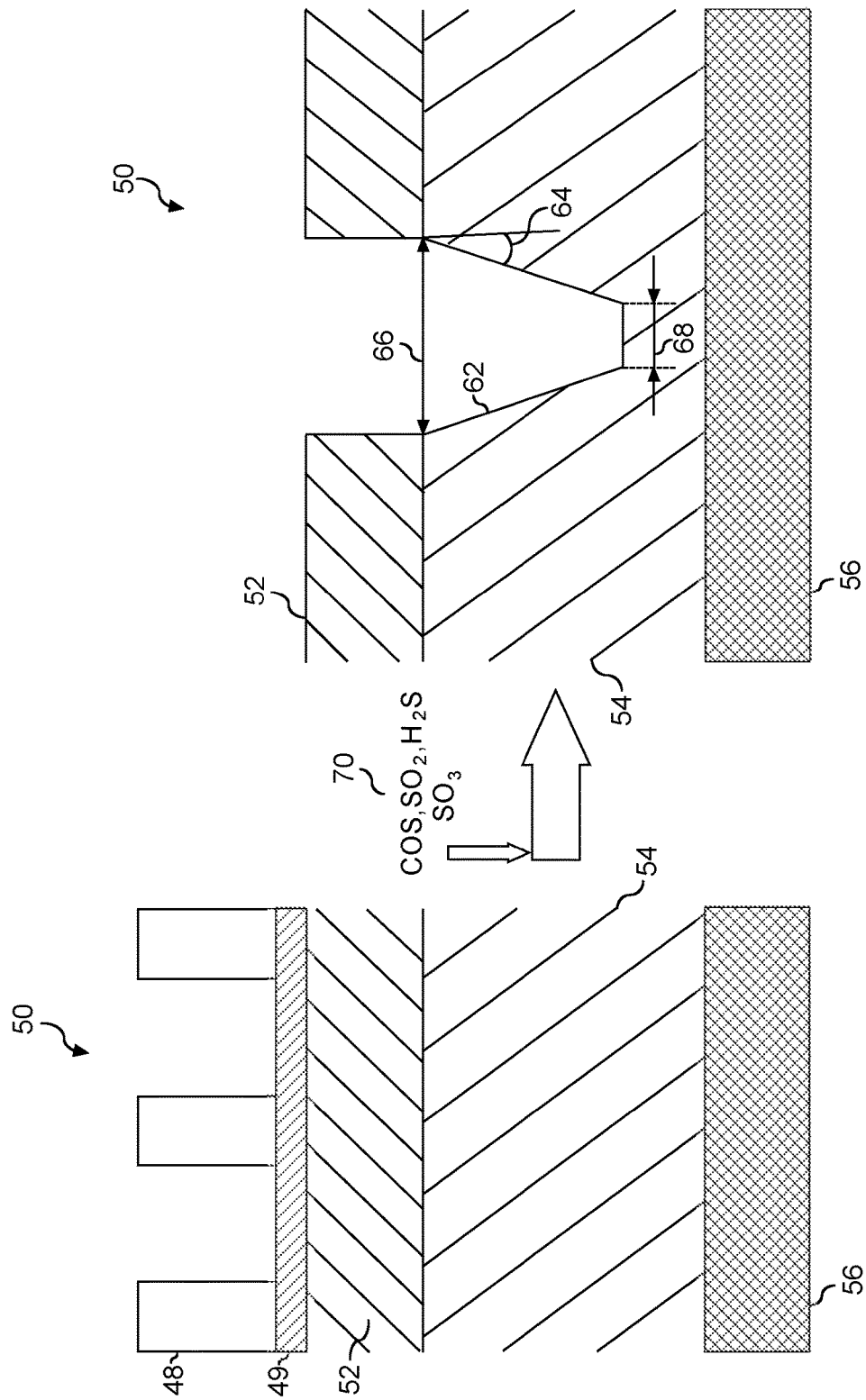
FIG. 2 depicts an example carbon containing hardmask removal process on a structure according to example embodiments of the present disclosure.

FIG. 2 depicts an example carbon containing hardmask etch process on a structure 50 according to example embodiments of the present disclosure. A plasma etch process 70 (e.g., a hardmask open process) according to example aspects of the present disclosure can be conducted on the structure 50 to open the dielectric hardmask layer 52 and the carbon containing hardmask layer 54. The plasma strip process 70 exposes the dielectric hardmask layer 52 to one or more species generated in a plasma chamber from a sulfur containing gas (e.g., COS, $SO_2$, $H_2S$, $SO_3$) to open the dielectric hardmask layer 52. The sulfur containing gas does not include a halogen containing gas.

After opening the dielectric hardmask layer 52, the plasma etch process 70 then exposes the carbon containing hardmask layer 54 to the one or more species to open the carbon containing hardmask layer 54. As can be seen in FIG. 2, the carbon containing hardmask layer 54 forms a trench feature with a deep sloped profile 62 having a slope angle 64. The slope angle 64 is smaller than the slop angle 60 in FIG. 1. Bottom critical dimension (CD) of the carbon containing hardmask layer 54 is less than half of top CD of the carbon containing hardmask layer 54.

In some embodiments, the structure 50 includes an anti-reflective coating layer 49 between the photoresist layer 48 and the dielectric hardmask layer 52. The plasma etch process 70 according to example aspects of the present disclosure can be conducted on the structure 50 to remove the photoresist layer 48 and the anti-reflective coating layer 49, and to open the dielectric hardmask layer 52 and the carbon containing hardmask layer 54. Any remaining photoresist layer 48 can be removed using a plasma strip process or other strip process.

Figure 3:
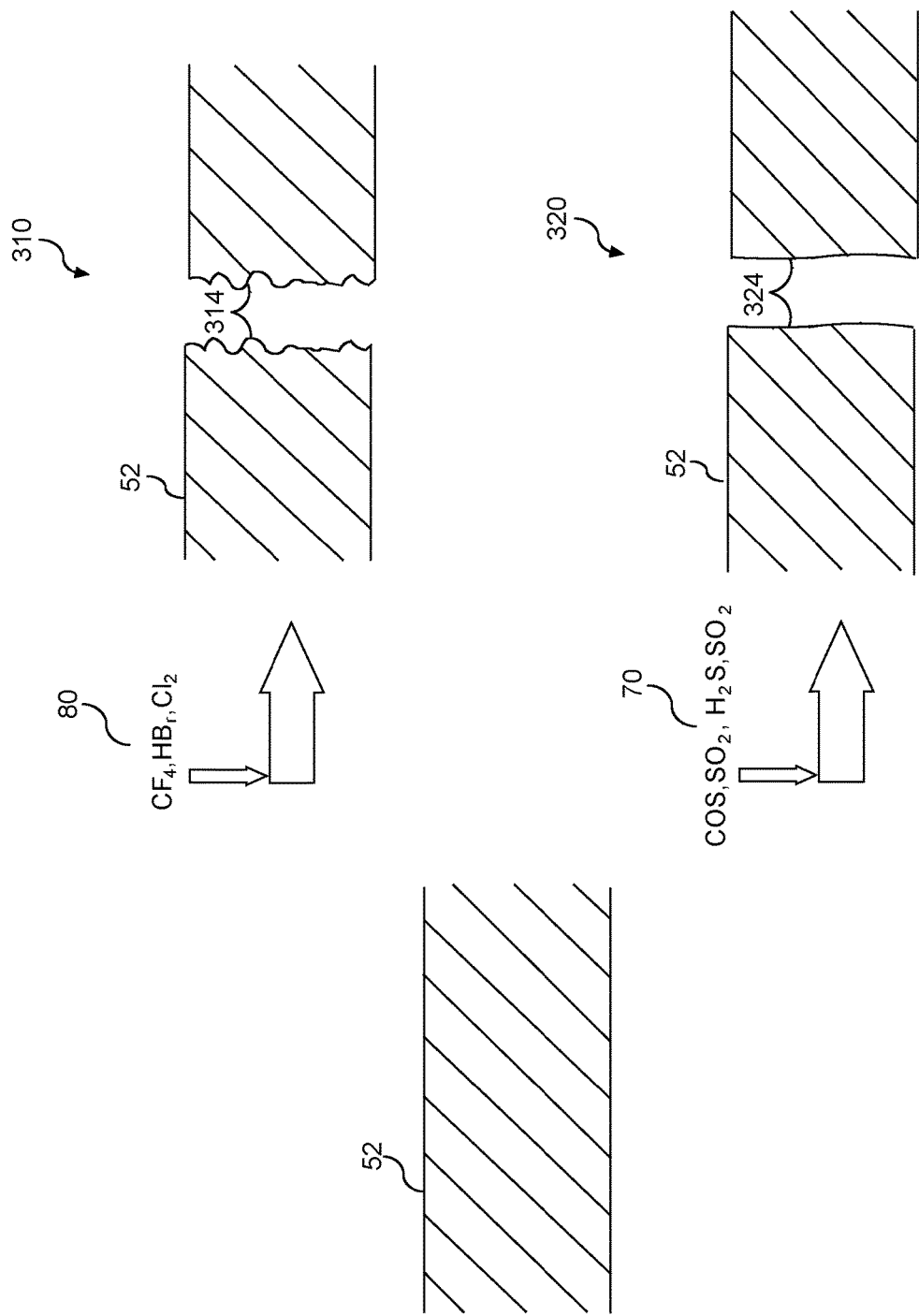
FIG. 3 depicts an example removal process for a dielectric hardmask on top of a carbon containing hardmask according to example embodiments of the present disclosure.

FIG. 3 depicts an example etch process for a dielectric hardmask 52 on top of a carbon containing hardmask according to example embodiments of the present disclosure. A conventional plasma etch process 80 (e.g., a hardmask open process) can be conducted on the dielectric hardmask layer 52. In this process, the plasma strip process 80 exposes the dielectric hardmask layer 52 to one or more species generated in a plasma chamber from a halogen containing gas. As can be seen in FIG. 3, the dielectric hardmask layer 52 forms a trench feature with a profile 314.

A plasma etch process 70 (e.g., a hardmask open process) according to example aspects of the present disclosure can be conducted on a dielectric hardmask layer 52 to open the dielectric hardmask layer 52. The plasma etch process 70 exposes the dielectric hardmask layer 52 to one or more species generated in a plasma chamber from a sulfur containing gas (e.g., COS, $SO_2$, $H_2S$, $SO_3$) to open the dielectric hardmask layer 52. The sulfur containing gas does not include a halogen containing gas. As can be seen in FIG. 3, the dielectric hardmask layer 52 forms a trench feature with a profile 324. Compared with opened dielectric hardmask layer 310, opened dielectric hardmask layer 320 has a smoother profile 324 than the profile 314.

Figure 4:
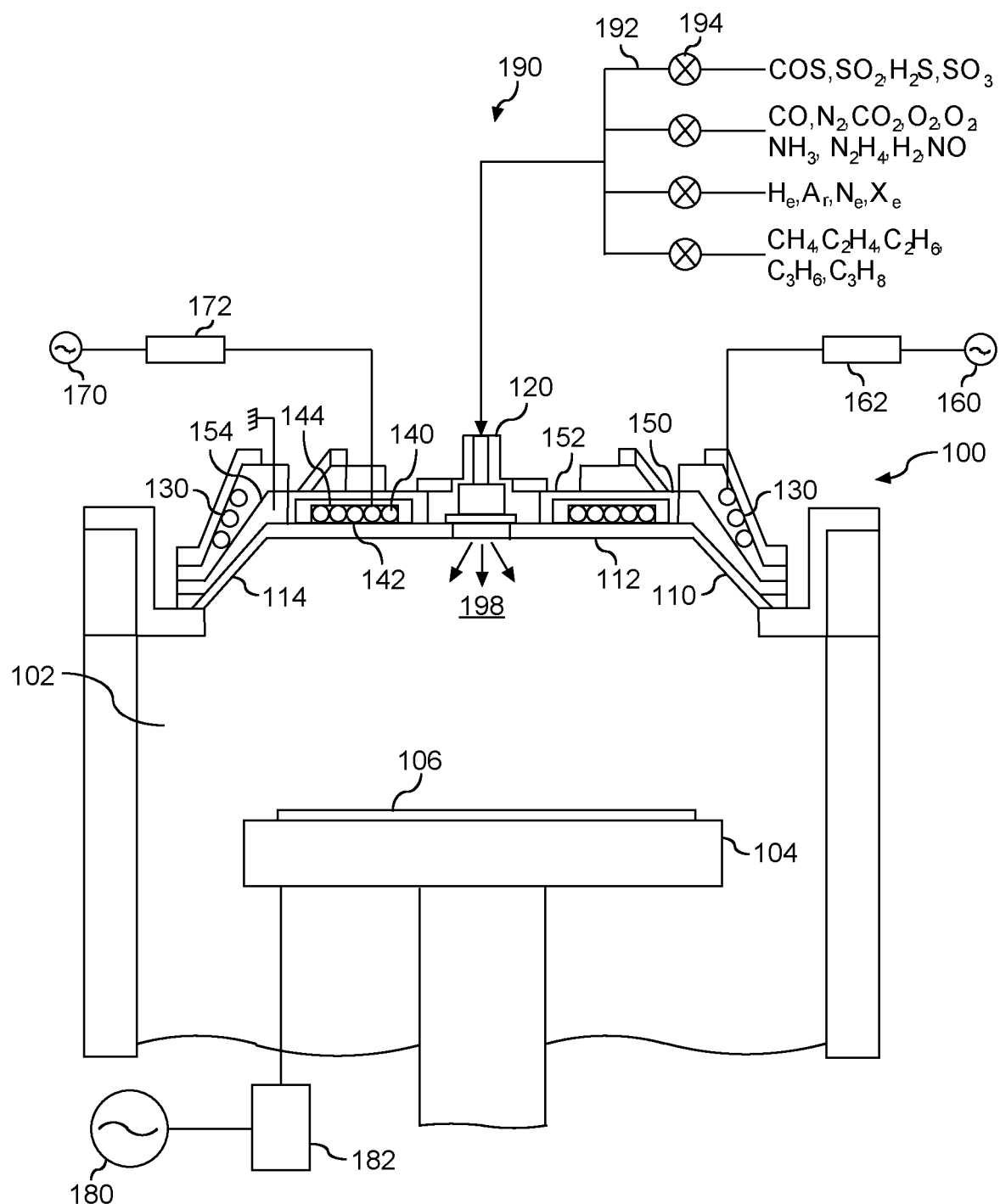
FIG. 4 depicts an example plasma processing apparatus according to example embodiments of the present disclosure.

FIG. 4 depicts an example plasma processing apparatus 100 according to example embodiments of the present disclosure. The plasma processing apparatus 100 includes a processing chamber defining an interior space 102. A workpiece support 104 (e.g., pedestal or substrate holder) is used to support a substrate 106, such as a semiconductor wafer, within the interior space 102. A dielectric window 110 is located above the workpiece support 104. The dielectric window 110 includes a relatively flat central portion 112 and an angled peripheral portion 114. The dielectric window 110 includes a space in the central portion 112 for a showerhead 120 to feed process gas into the interior space 102.

The apparatus 100 further includes a plurality of inductive elements, such as primary inductive element 130 and secondary inductive element 140, for generating an inductive plasma in the interior space 102. The inductive elements 130, 140 can include a coil or antenna element that when supplied with RF power, induces a plasma in the process gas in the interior space 102 of plasma processing apparatus 100. For instance, a first RF generator 160 can be configured to provide electromagnetic energy through a matching network 162 to the primary inductive element 130. A second RF generator 170 can be configured to provide electromagnetic energy through a matching network 172 to the secondary inductive element 140.

While the present disclosure makes reference to a primary inductive element and a secondary inductive element, those of ordinary skill in the art, should appreciate that the terms primary and secondary are used for convenience purposes only. The secondary inductive element can be operated independent of the primary inductive element, and vice versa.

The apparatus 100 can include a metal shield portion 152 disposed around the secondary inductive element 140. As discussed in more detail below, metal shield portion 152 separates the primary inductive element 130 and the secondary inductive element 140 to reduce cross-talk between the inductive elements 130, 140. Apparatus 100 can further include an electrostatic shield 154 disposed between the primary inductive element 130 and the dielectric window 110. The electrostatic shield 154 is grounded. Electrostatic shield 154 can be a slotted metal shield that reduces capacitive coupling between the primary inductive element 154 and the interior space 102. As illustrated, the electrostatic shield 154 fits over the angled portion of the dielectric window 110.

In a particular embodiment, metal shield 152 and electrostatic shield 154 can form a unitary body 150 for ease of manufacturing and other purposes. The multi-turn coil of the primary inductive element 130 can be located adjacent the electrostatic shield portion 154 of the unitary body metal shield/electrostatic shield 150. The secondary inductive element 140 can be located proximate the metal shield portion 152 of metal shield/Faraday shield unitary body 150, such as between the metal shield portion 152 and the dielectric window 110.

The arrangement of the primary inductive element 130 and the secondary inductive element 140 on opposite sides of the metal shield 152 allows the primary inductive element 130 and secondary inductive element 140 to have distinct structural configurations and to perform different functions. For instance, the primary inductive element 130 can include a multi-turn coil located adjacent a peripheral portion of the process chamber. The primary inductive element 130 can be used for basic plasma generation and reliable start during the inherently transient ignition stage. The primary inductive element 130 can be coupled to a powerful RF generator and auto-tuning matching network and can be operated at an increased RF frequency, such as at about 13.56 MHz.

The secondary inductive element 140 can be used for corrective and supportive functions and for improving the stability of the plasma during steady state operation. Since the secondary inductive element 140 can be used primarily for corrective and supportive functions and improving stability of the plasma during steady state operation, the secondary inductive element 140 does not have to be coupled to as powerful an RF generator as the first inductive element 130 and can be designed differently and cost effectively to overcome the difficulties associated with previous designs. As discussed in detail below, the secondary inductive element 140 can also be operated at a lower frequency, such as at about 2 MHz, allowing the secondary inductive element 140 to be very compact and to fit in a limited space on top of the dielectric window.

In some embodiments, the primary inductive element 130 and the secondary inductive element 140 can be energized with a separate RF sources at a different RF frequency. For instance, the primary inductive element 130 can be energized with a first RF generator 160 at a first RF frequency. The secondary inductive element 140 can be energized with a second RF generator 170 at a second RF frequency. The primary inductive element 130 and the secondary inductive element 140 are operated at different frequencies. The frequencies are sufficiently different to reduce cross-talk between the primary inductive element 130 and the secondary inductive element 140. For instance, the frequency applied to the primary inductive element 130 can be at least about 1.5 times greater than the frequency applied to the secondary inductive element 140. In a particular embodiment, the frequency applied to the primary inductive element 130 can be about 13.56 MHz and the frequency applied to the secondary inductive element 140 can be in the range of about 1.75 MHz to about 2.15 MHz. Other suitable frequencies can also be used, such as about 400 kHz, about 4 MHz, and about 27 MHz. While the present disclosure is discussed with reference to the primary inductive element 130 being operated at a higher frequency relative to the secondary inductive element 140, those of ordinary skill in the art, using the disclosures provided herein, should understand that the secondary inductive element 140 could be operated at the higher frequency without deviating from the scope of the present disclosure.

The plasma processing apparatus 100 includes a bias source having bias electrode in the workpiece support 104. The bias electrode can be coupled to an RF power generator 180 via a suitable matching network 182. The processing chamber can include a gas exhaust port for evacuating a gas from the processing chamber. In some embodiments, a ratio between an RF source power of the RF source (e.g., the RF source 160, or the RF source 170) and a bias power of the RF bias source 180 can be in a range of about 2:1 to about 20:1.

As shown in FIG. 4, the apparatus 100 can include a gas delivery system 190 configured to deliver process gas to a plasma chamber 198, for instance, via the showerhead 120. The gas delivery system can include a plurality of feed gas lines 192. The process gas can be delivered to the interior space 102.

The feed gas lines 192 can be controlled using valves and/or mass flow controllers to deliver a desired amount of gases into the plasma chamber as process gas. As shown in FIG. 4, the gas delivery system 190 can include feed gas line(s) for delivery of sulfur containing gas (e.g., can include carbonyl sulfide (COS), sulfur dioxide ($SO_2$), hydrogen sulfide ($H_2S$), or sulfur trioxide ($SO_3$), etching gas (e.g., carbon monoxide (CO), nitrogen ($N_2$), carbon dioxide ($CO_2$), oxygen ($O_2$), ozone ($O_3$), water vapor ($H_2O$), hydrogen peroxide ($H_2O_2$), nitrogen trihydride ($NH_3$), dinitrogen tetrahydride ($N_2H_4$), hydrogen ($H_2$), or nitrogen monoxide (NO), inert gas (e.g., helium (He), argon (Ar), neon (Ne), or xenon (Xe), and passivation gas (e.g., methane ($CH_4$), ethylene ($C_2H_4$), ethane ($C_2H_6$), propene ($C_3H_6$), or propane ($C_3H_8$).

FIG. 4 depicts one example processing apparatus that can be used to implement the hardmask opening process(es) according to example embodiments of the present disclosure. Other plasma processing apparatus can be used without deviating from the scope of the present disclosure.

Figure 5:
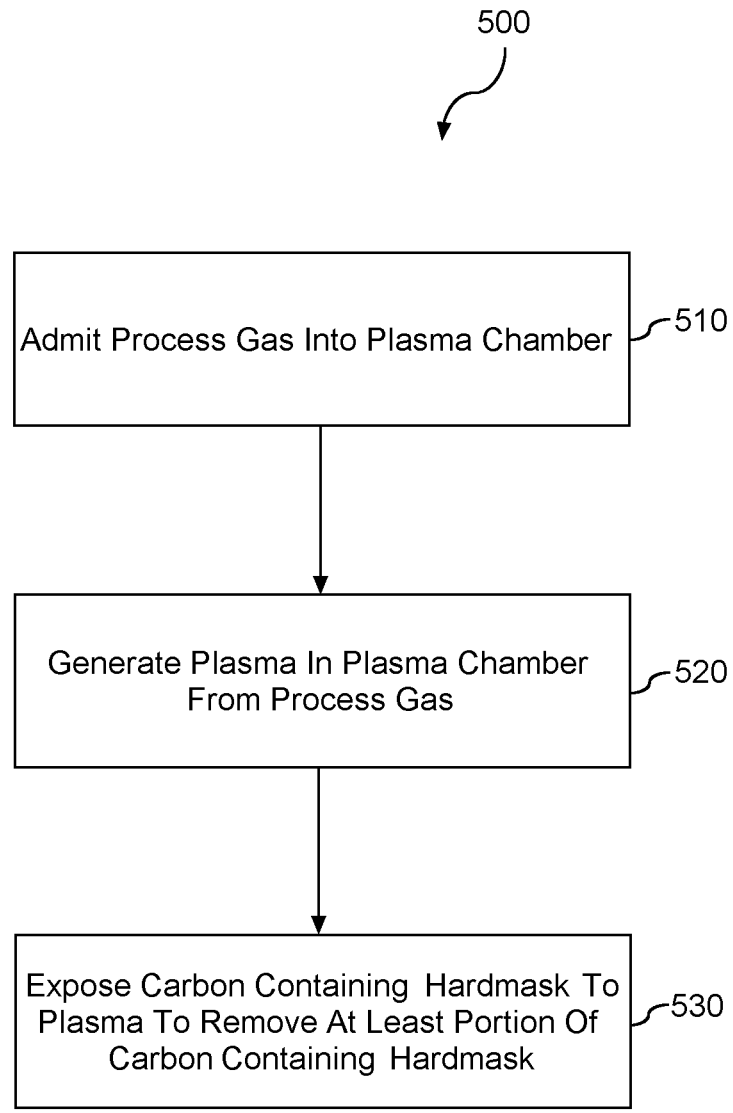
FIG. 5 depicts a flow diagram of an example process according to example embodiments of the present disclosure.

FIG. 5 depicts a flow diagram of an example process (500) according to example embodiments of the present disclosure. The process (500) will be discussed with reference to the plasma processing apparatus 100 of FIG. 4 by way of example. The process (500) can be implemented in any suitable plasma processing apparatus. FIG. 5 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (510), the process can include admitting a process gas in to a plasma chamber. For example, the plasma processing apparatus 100 can admit a process gas into the plasma chamber 198 via the gas delivery system 190. The gas delivery system 190 can include feed gas line(s) for delivery of sulfur containing gas (e.g., can include carbonyl sulfide (COS), sulfur dioxide ($SO_2$), hydrogen sulfide (HS), or sulfur trioxide ($SO_3$), etching gas (e.g., carbon monoxide (CO), nitrogen ($N_2$), carbon dioxide ($CO_2$), oxygen ($O_2$), ozone ($O_3$), water vapor ($H_2O$), hydrogen peroxide ($H_2O_2$), nitrogen trihydride ($NH_3$), dinitrogen tetrahydride ($N_2H_4$), hydrogen ($H_2$), or nitrogen monoxide (NO), inert gas (e.g., helium (He), argon (Ar), neon (Ne), or xenon (Xe), and/or passivation gas (e.g., methane ($CH_4$), ethylene ($C_2H_4$), ethane ($C_2H_6$), propene ($C_3H_6$), or propane ($C_3H_8$).

At (520), the process can include generating a plasma in the plasma chamber from the process gas using an inductively coupled plasma source. For example, the plasma processing apparatus 100 can generate the plasma from the process gas using the inductive coupling element 130 and/or the inductive coupling element 140. The inductive coupling element 130 is energized with an RF source 160 to generate the plasma. The inductive coupling element 140 is energized with an RF source 170 to generate the plasma. The inductive coupling element 130 and the inductive coupling element 140 can operate at a different RF frequency.

In some embodiments, the inductive coupling element 130 and/or inductive coupling element 140 can be separated from the plasma chamber 198 by a grounded electrostatic shield 154. In some embodiments, the grounded electrostatic shield 154 can be located between the inductive coupling element 130 and/or inductive coupling element 140 and the dielectric window 110. In some embodiments, a pressure of the plasma chamber 198 can be less than about 20 millitorr (mT).

In some embodiments, the process can further include energizing an RF bias source. For instance, the plasma processing apparatus 100 can include the RF bias source 180 coupled to the workpiece support 104. In some embodiments, a ratio between an RF source power of the RF source 160 or 170 and a bias power of the RF bias source 180 can be in a range of about 2:1 to about 20:1.

At (530), the process can include exposing carbon containing hardmask to the plasma to remove at least a portion of the carbon containing hardmask. For instance, the process can include etching the carbon containing hardmask layer 54 to form various trench features such that the carbon containing hardmask layer 54 can have a profile of a cross-section with various shapes (e.g., a slight sloped profile 58, or a deep sloped profile 62). The process can include etching the dielectric hardmask layer 52 prior to etching the carbon containing hardmask layer 54. In some embodiments, the process can include conducting a strip process for removal of photoresist subsequent to the dielectric hardmask etch process. For instance, after the dielectric hardmask etch process and prior to the carbon containing hardmask process, a strip process can be performed to remove one or more patterned photoresists.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A process for etching a carbon containing hardmask on a workpiece, the process comprising:
    admitting a process gas into a plasma chamber, the process gas comprising a sulfur containing gas and a passivation gas, wherein the process gas does not include a halogen containing gas;
    generating a plasma in the plasma chamber from the process gas using an inductively coupled plasma source, the inductively coupled plasma source separated from the plasma chamber by a grounded electrostatic shield; and
    exposing the carbon containing hardmask to the plasma to remove at least a portion of the carbon containing hardmask;
    wherein the passivation gas is one or more of methane ($CH_4$), ethylene ($C_2H_4$), ethane ($C_2H_6$), propene ($C_3H_6$), or propane ($C_3H_8$).

2. The process of claim 1, wherein the sulfur containing gas comprises carbonyl sulfide (COS), sulfur dioxide ($SO_2$), hydrogen sulfide ($H_2S$), or sulfur trioxide ($SO_3$).

3. The process of claim 1, wherein the process gas further comprises an etching gas.

4. The process of claim 3, wherein the etching gas comprises carbon monoxide (CO), nitrogen ($N_2$), carbon dioxide ($CO_2$), oxygen ($O_2$), ozone ($O_3$), water vapor ($H_2O$), hydrogen peroxide ($H_2O_2$), nitrogen trihydride ($NH_3$), dinitrogen tetrahydride ($N_2H_4$), hydrogen ($H_2$), or nitrogen monoxide (NO).

5. The process of claim 1, wherein the process gas further comprises an inert gas.

6. The process of claim 5, wherein the inert gas comprises helium (He), argon (Ar), neon (Ne), or xenon (Xe).

7. The process of claim 1, wherein exposing the carbon containing hardmask to the plasma to remove at least the portion of the carbon containing hardmask forms a trench feature with a vertical profile.

8. The process of claim 1, wherein exposing the carbon containing hardmask to the plasma to remove at least the portion of the carbon containing hardmask forms a trench feature with a sloped profile.

9. The process of claim 8, wherein exposing the carbon containing hardmask to the plasma to remove at least the portion of the carbon containing hardmask forms a trench feature with a sloped profile such that a bottom critical dimension of the carbon containing hardmask is less than half of a top critical dimension of the carbon containing hardmask.

10. The process of claim 1, wherein the grounded electrostatic shield is located between the inductively coupled plasma source and a dielectric window forming at least a portion of the plasma chamber.

11. The process of claim 1, wherein when the inductively coupled plasma source is energized with a radio frequency (RF) source to generate the plasma, the process further comprises energizing an RF bias source.

12. The process of claim 11, wherein a ratio between an RF source power of the RF source and a bias power of the RF bias source is in a range of about 2:1 to about 20:1.

13. The process of claim 11, wherein the RF bias source is coupled to a workpiece support configured to support the workpiece in a processing chamber.

14. The process of claim 1, wherein a pressure of the plasma chamber is less than about 20 mT.

15. The process of claim 1, wherein the inductively coupled plasma source comprises a first inductive coupling element and a second inductive coupling element, the first inductive coupling element and the second inductive coupling element energized with RF energy at different RF frequencies.

16. The process of claim 1, wherein the carbon containing hardmask is located below a dielectric hardmask on the workpiece.

17. The process of claim 16, wherein exposing the carbon containing hardmask to the plasma to remove at least the portion of the carbon containing hardmask is performed after a dielectric hardmask etch process.

18. The process of claim 17, further comprising conducting a strip process for removal of photoresist subsequent to the dielectric hardmask etch process.

* * * * *